United States Patent [19]

Neugebauer, deceased et al.

[11] Patent Number: 5,336,928
[45] Date of Patent: Aug. 9, 1994

[54] HERMETICALLY SEALED PACKAGED ELECTRONIC SYSTEM

[75] Inventors: Constantine A. Neugebauer, deceased, late of Schenectady, N.Y., by Martha M. Neugebauer, executrix; Robert J. Wojnarowski, Ballston Lake, both of N.Y.

[73] Assignee: General Electric Company, Schenectady, N.Y.

[21] Appl. No.: 947,190

[22] Filed: Sep. 18, 1992

[51] Int. Cl.⁵ .................... H01L 23/48; H01L 23/538
[52] U.S. Cl. .................................. 257/758; 257/700; 257/759
[58] Field of Search ............ 257/747, 748, 750, 753, 257/757, 758, 759, 761, 764, 766

[56] References Cited

U.S. PATENT DOCUMENTS

| | | | |
|---|---|---|---|
| 4,714,516 | 12/1987 | Eichelberger et al. | 156/628 |
| 4,761,345 | 8/1988 | Sato et al. | 257/761 |
| 4,764,485 | 8/1988 | Loughran et al. | 437/225 |
| 4,780,177 | 10/1988 | Wojnarowski et al. | 156/643 |
| 4,783,695 | 11/1988 | Eichelberger et al. | 357/65 |
| 4,835,704 | 5/1989 | Eichelberger et al. | 364/490 |
| 4,840,302 | 6/1989 | Gardner et al. | 257/751 |
| 4,842,677 | 6/1989 | Wojnarowski et al. | 156/643 |
| 4,878,991 | 11/1989 | Eichelberger et al. | 156/630 |
| 4,884,122 | 11/1989 | Eichelberger et al. | 357/71 |
| 4,894,115 | 1/1990 | Eichelberger et al. | 156/643 |
| 4,937,203 | 6/1990 | Eichelberger et al. | 437/51 |
| 4,999,700 | 3/1991 | Dunaway et al. | 257/666 |
| 5,073,814 | 12/1971 | Cole, Jr. et al. | 257/758 |
| 5,081,563 | 1/1992 | Feng et al. | 257/700 |

Primary Examiner—Rolf Hille
Assistant Examiner—David B. Hardy
Attorney, Agent, or Firm—Geoffrey H. Krauss

[57] ABSTRACT

A hermetically sealed electronic package particularly adapted for high density interconnect (HDI) electronic systems, employs a ceramic substrate as the package base. The substrate is provided with module contact pads. A barrier support frame on the module contact pads divides them into inner and outer portions. A plurality of electronic components, such as integrated circuit chips, are fastened to the substrate within the perimeter of the barrier support frame, and interconnections are provided between inner portions of the module contact pads and contact pads on the electronic components. A polymer barrier layer is deposited over the area enclosed by the barrier support frame as well as a portion of the frame itself, and is overlaid with a metal barrier layer. A protective solder layer is deposited on the metal barrier layer to bridge any voids in the metal barrier layer.

9 Claims, 2 Drawing Sheets

HERMETICALLY SEALED PACKAGED ELECTRONIC SYSTEM

CROSS-REFERENCE TO RELATED APPLICATIONS

The present application is related to copending commonly assigned U.S. Pat. No. 5,291,066 filed on Nov. 14, 1991, entitled "Moisture-Proof Electrical Circuit High Density Interconnect Module and Method of Making the Same" and now allowed Ser. No. 08/073,250, filed Jun. 7, 1993 as a continuation of Ser. No. 07/807,325, filed on Dec. 16, 1991, now abandoned, entitled "Hermetically Packaged HDI Electronic System", both being hereby incorporated herein by reference.

1. Field of the Invention

This invention is related to high density interconnect (HDI) circuits and, more particularly, is directed to hermetically sealed HDI circuit configurations and to a method for producing the same.

2. Background of the Invention

HDI circuits comprise a plurality of interconnected circuit chips mounted on a substrate where the chips are interconnected by a metallized pattern created on a polymer overlayer. Such HDI circuits are described by Eichelberger et al. in a commonly assigned U.S. Pat. 4,783,695, issued Nov. 8, 1988, incorporated herein by reference. Typically, the metallized pattern is formed by a computer-controlled laser lithography system, such as described in a commonly assigned U.S. Pat. 4,835,704, issued May 30, 1989, incorporated herein by reference. Typically, a high density interconnect structure incorporates between thirty to fifty or even more integrated circuit chips that are assembled and interconnected on a single HDI substrate having a width and length of about 50 millimeters (mm) and a thickness of about 1.27 mm.

This HDI structure can be disassembled for repair or replacement of a faulty component and then reassembled without significant risk to the properly functioning (i.e. good) components incorporated within the system. Ease of repairability is an important consideration where fifty or more chips having a cost of as much as $2000 each, may be incorporated on a single substrate. Exemplary testing and repair techniques are disclosed by Eichelberger et al. in the U.S. Pat. Nos. 4,878,991, 4,884,122 and 4,937,203, issued Nov. 7, 1989, Nov. 28, 1989 and Jun. 26, 1990, respectively, all incorporated herein by reference.

An important objective of HDI technology is to produce HDI circuit configurations or packages that can operate in hostile environments, such as high humidity conditions. Another objective is to produce HDI circuit configurations with a high degree of reliability. The aforementioned requirements are met by providing HDI circuit configurations with means for preventing infiltration of moisture within the various integrated circuit components of the HDI circuit configurations. By hermetically sealing the HDI circuit packages, outside contaminants or other deleterious materials, such as moisture, are prevented from reaching sensitive components or connections. Hermetic sealing also prevents HDI circuit packages, built within specifications, from deteriorating further when exposed to hostile environments. This high degree of reliability is particularly important in systems such as those used in orbiting satellites or in electronic devices operating in high humidity environments.

Various measures have been devised to hermetically seal electronic components of HDI packages; for example, by placing the HDI package inside a sealed metal enclosure. Aside from its relatively high cost, a metal enclosure adds bulk and weight, offsetting some of the salient advantages associated with use of an HDI package. The aforementioned concept has been significantly improved in commonly assigned copending application Ser. No. 07/807,325 wherein a package lid made of Kovar metal alloy is sealed by heating it against a solder seal ring affixed to a substrate within which a plurality of integrated circuit chips are positioned. In yet another protection technique, disclosed in commonly assigned copending application Ser. No. 07/791,690, an HDI package is surrounded with a moisture barrier layer of titanium oxide or silicon oxide. Moisture barriers made from polymeric films have also been tried; however, experience has shown that a polymer material is susceptible to moisture infiltration on the molecular level.

STATEMENT OF INVENTION

It is therefore an object of this invention to provide a method of making an improved hermetically sealed HDI circuit configuration that is simple and which poses minimal risk of damage to the interconnected components of the HDI circuit configuration.

Another object of the invention is to provide an electrical circuit module of improved overall reliability.

Another object of the invention is to provide a method of hermetically sealing an electric circuit that is insensitive to outside pressure, as a lid sealed assembly inherently is.

Yet another object of the invention is to provide a lightweight, hermetically sealed HDI circuit configuration having strong and compliant barrier layers which accommodate thermal expansion mismatch between the barrier layers and the underlying substrate of the lightweight hermetically sealed HDI circuit configuration.

Still another object of the present invention is to provide a lightweight, hermetically sealed HDI circuit configuration that can be repaired with minimum risks to the interconnected integrated circuit chips enclosed therein.

The present invention is directed to a method of hermetically sealing a packaged electronic system, comprising depositing a plurality of module contact pads on a desired surface of a substrate, depositing a barrier support frame having a rim on the desired surface such that the plurality of the module contact pads are divided into outer and inner portions, positioning on the desired surface within the perimeter of the barrier support frame a plurality of electronic components having interconnection pads thereon, applying a polymer dielectric film to cover and bond to the barrier support frame and the plurality of the electronic components, perforating the polymer dielectric film to form via openings therein aligned with at least some of the interconnection pads and inner portions of the module contact pads, depositing a pattern of interconnection conductors on the polymer dielectric film to provide electrical connection between at least some of the interconnection pads and the inner portions of the module contact pads, laminating a polymer barrier layer on the polymer dielectric film to entirely cover the area enclosed within the barrier support frame and to partially cover the barrier support frame, depositing a metal barrier layer on the polymer barrier layer to entirely seal the area enclosed within the polymer barrier layer and to substantially cover the barrier support frame, and depositing a protective layer on the metal barrier layer to prevent mechanical damage and bridge any voids situated in the metal barrier layer.

The present invention is further directed to a hermetically sealed packaged electronic system comprising, a substrate, a plurality of module contact pads disposed on a desired surface of the substrate, a barrier support frame having a rim disposed on the desired surface, the frame dividing the plurality of the module contact pads into inner and outer portions, a plurality of electronic components positioned within the perimeter of the barrier support frame and having interconnection pads thereon, a polymer dielectric film overlying and bridging the integrated circuit chips and having a plurality of via openings therein aligned with at least some of the interconnection pads, a pattern of interconnection conductors disposed on the polymer dielectric film to provide electrical connection between at least some of the interconnection pads and the inner portions of the module contact pads, a polymer barrier layer disposed on the polymer dielectric film so as to entirely cover the area enclosed within the barrier support frame and partially cover the barrier support frame, a metal barrier layer disposed on the polymer barrier layer so as to entirely cover the area enclosed within the polymer barrier layer and substantially cover the barrier support frame, and a protective layer disposed on the polymer barrier layer so as to bridge any voids situated in the metal barrier layer and prevent mechanical damage.

BRIEF DESCRIPTION OF DRAWINGS

The foregoing and other objects, aspects and advantages of the invention will be understood from the following detailed description of the invention with reference to the drawings, in which.

DETAILED DESCRIPTION OF THE PREFERRED EMBODIMENTS OF THE INVENTION

Figure 1:
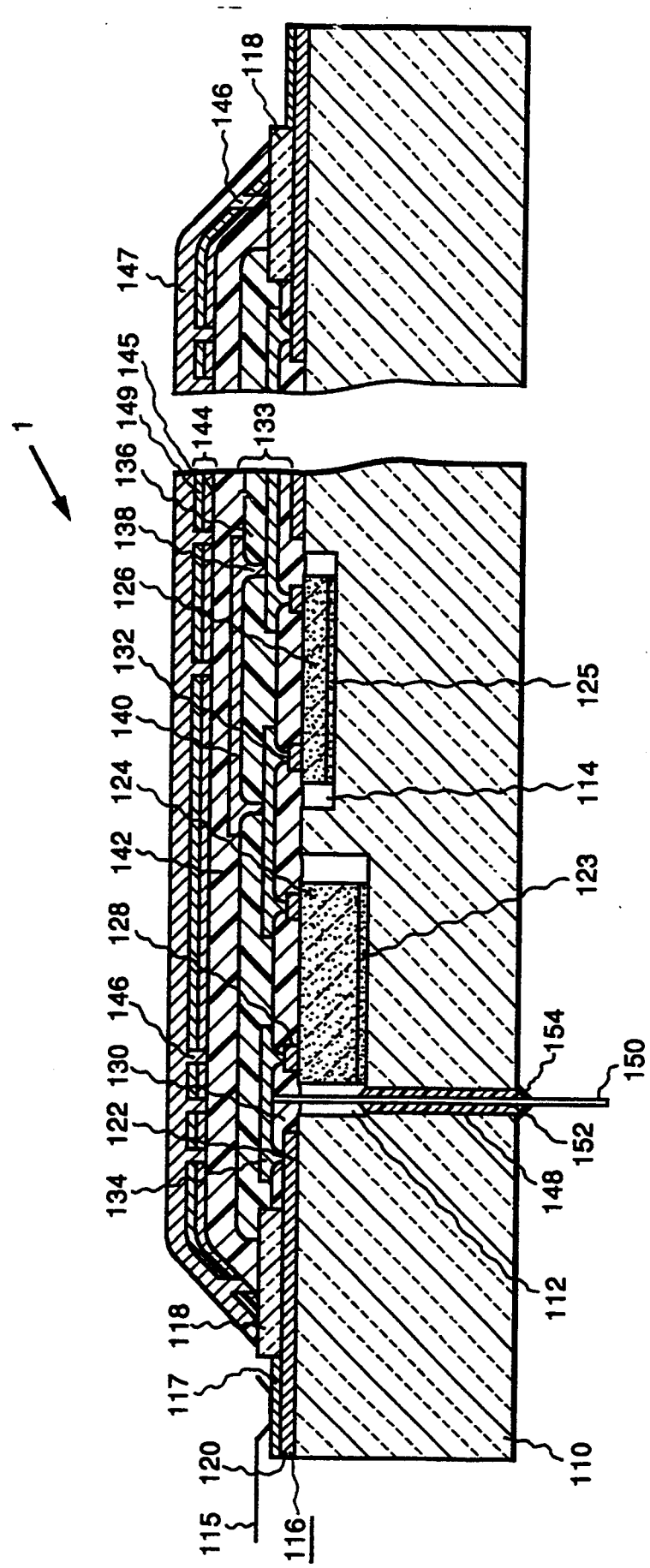
FIG. 1 is a partial cross-sectional side view of a preferred embodiment of the present invention.

FIG. 1 illustrates, in cross section, a preferred embodiment of a hermetically sealed packaged electronic system, such as a hermetically sealed multichip integrated circuit package 1. Package 1 includes a substrate 110, which, in accordance with the invention, also serves as the base of the completed hermetic package. In accordance with the HDI fabrication process, substrate 110 may, for example, have a thickness of about 0.635 to about 2.54 mm (25 to 100 mils) and may be comprised of alumina ($Al_2O_3$) or aluminum nitride (AlN); alumina is preferred. As shown in FIG. 1, a portion of a desired surface of substrate 110, i.e. a component supporting surface, includes a cavity 112 and a cavity 114. If desired, however, substrate 110 may be provided with a single cavity, or with more than two cavities. A plurality of electrical circuit components, e.g. integrated circuit chips 124 and 126 having interconnection pads 128 thereon, are positioned within cavities 112 and 114, respectively.

Cavities 112 and 114 may be formed by starting with a bare substrate having a uniform thickness and desired size. Conventional, laser or ultrasonic milling is used to produce the aforementioned cavities 112 and 114 in which various electronic components, such as very large scale integrated (VLSI) circuit chips, are to be positioned. Where a relatively thicker or relatively thinner electronic component will be placed, the corresponding cavity bottom is made respectively deeper or shallower.

The desired surface of substrate 110 is further provided with a plurality of module contact pads 116 which comprise electrically conductive materials, such as gold, aluminum, copper or tungsten. Tungsten is preferred. Pads 116 are preferably screen printed and then cofired with substrate 110 in a process described in greater detail hereinbelow with reference to FIG. 2A.

FIG. 1 further shows a barrier support frame 118 disposed on the desired surface of substrate 110 and preferably shaped as a rectangular picture frame. Barrier support frame 118 is positioned on module contact pads 116 and serves as a boundary that divides contact pads 116 into outer portions 120, i.e. portions outside the perimeter of frame 118 and inner portions 122, i.e. portions within the perimeter of frame 118. Barrier support frame 118 is preferably comprised of glass but may alternatively comprise glass and ceramic. Size and shape of barrier support frame 118 is such that cavities 112, 114 and inner portions 122 of contact pads 116 are located within its perimeter. Barrier support frame 118 is provided with minimal thickness, preferably of about 2 to about 10 mils, to ensure proper application of polymer dielectric films 130 and 136, described hereinbelow. Barrier support frame 118 is preferably screen printed and then cofired with substrate 110.

Outer portions 120 of module contact pad 116 are preferably provided with a corrosion resistant coating 117 of material such as gold. Individual leads 115 of a conventional lead frame (not shown) are attached to outer portions 120 of barrier support frame 118. It will be appreciated that, prior to actual mounting of packaged electronic system 1 on a printed circuit board, the conventional lead frame is severed from individual leads 115.

The bottoms of cavities 112 and 114 are provided with a thermoplastic adhesive layer 123 and 125, respectively. Adhesive layers 123 and 125 are preferably comprised of ULTEM ® polyetherimide, resin available from General Electric Company, Pittsfield, Mass. After placing various electronic components, such as chips 124 and 126, in cavities 112 and 114, respectively, the entire structure is heated to the softening point of polyetherimide of about 217° C. to about 235° C. and then cooled to thermoplastically bond chips 124 and 126 to cavities 112 and 114 respectively.

At this stage, the upper surfaces of all the electronic components, such as chips 124 and 126 and the unmilled portion of the desired surface of substrate 110 are substantially coplanar. A multi-layer HDI overcoat structure 133 is then built up to electrically interconnect the electronic components, such as chips 124 and 126 into an actual functioning system. To begin build-up of HDI overcoat structure 133, a polymer dielectric film 130, preferably comprised of KAPTON polyimide resin produced by E.I. duPont de Nemours and Company, Wilmington, Del., having a thickness of about 0.5 to about 3 mil, is pretreated to promote adhesion. Polymer dielectric film 130 may be comprised of thermoplastic or thermosetting material. One side of polymer dielectric film 130 is coated with ULTEM polyetherimide resin or some other suitable thermoplastic resin layer (not shown) and then bonded to the top surfaces of chips 124 and 126 and to the desired surface of substrate 110 enclosed within barrier support frame 118. The ULTEM polyetherimide resin serves as a thermoplastic adhesive to hold film 130 in place. Preferably, the aforementioned bonding is conducted under vacuum conditions to prevent air entrapment between film 130 and substrate 110, thereby improving adhesion between the two.

Next, polymer dielectric film 130 and the adhesive coating (not shown) underneath film 130 are perforated, preferably by a laser beam, to form via openings 132 aligned with at least some of interconnection pads 128 on chips 124 and 126 and inner portions 122 of module contact pads 116. Exemplary laser drilling techniques are disclosed by Eichelberger et al. in commonly assigned U.S. Pat. Nos. 4,714,516 issued Dec. 22, 1987 and 4,894,115 issued Jan. 16, 1990; and by Loughran et al. in a commonly assigned U.S. Pat. No. 4,764,485 issued Aug. 16, 1988, each of which is hereby incorporated herein by reference.

Buildup of HDI overcoat structure 133 continues by depositing a pattern of metallized interconnection conductors 134 on polymer dielectric film 130 for providing electrical connection between at least some of interconnection contact pads 128 and inner portions 122 of module contact pads 116 through via openings 132. Interconnection conductors 134 may be patterned to form individual conductors while they are being applied over film 130, or they may be applied as a continuous layer and then patterned using conventional photoresist and etching techniques. However, the photoresist is preferably exposed to a laser beam, which is scanned relative to substrate 110 to provide an accurately aligned pattern of conductors 134. Metallized interconnection conductors 134 further comprise a layer of titanium (not shown) in direct contact with polymer dielectric film 130 and a layer of copper (not shown) deposited on top of the titanium layer. Exemplary techniques for forming interconnection conductors are disclosed by Wojnarowski et al. in commonly assigned U.S. Pat. Nos. 4,780,177 issued Oct. 25, 1988 and 4,842,677 issued Jun. 27, 1989; and by Eichelberger et al. in a commonly assigned U.S. Pat. No. 4,835,704 issued May 30, 1989, each of which is incorporated herein by reference. Any misposition of the individual electronic components, such as chips 124 and 126, and their interconnection pads 128, is compensated through use of an adaptive laser lithography system disclosed in the aforementioned U.S. Pat. No. 4,835,704.

An additional polymer dielectric film 136 with via openings 138 therein and a pattern of interconnection conductors 140 thereon is supplied as required on top of film 130 and conductors 134 to provide the remainder of the desired electrical connections among pads 128. Those skilled in the art will recognize that still further polymer dielectric films with the necessary patterns of interconnection conductors thereon (not shown) may be provided, if desired, on top of film 136 and conductors 140. Polymer dielectric films 130 and 136 cover the area enclosed by support barrier frame 118 and inner side of frame 118 closer to inner portions 122.

Next, a polymer barrier layer 142, preferably of KAPTON polyimide film and having a thickness of about 0.5 to about 10 mil, is laminated on polymer dielectric film 136. The aforementioned adhesion techniques are preferably employed to laminate layer 142 to film 136. Polymer barrier layer 142 covers the entire area enclosed within barrier support frame 118, including film 136, and partially covers barrier support frame 118. Portions of polymer barrier layer 142 that extend beyond barrier support frame 118 are removed, preferably through ablation by an excimer laser. In order to further improve the hermetic seal provided by the present invention, the edges of polymer dielectric films 130, 136 and polymer barrier layer 142 are provided with a smooth taper, preferably by means of an excimer laser.

Packaged electronic system 1 further comprises a metal barrier layer 144 disposed on top of polymer barrier layer 142. Metal barrier layer 144 together with polymer barrier layer 142 provide the hermetic seal for packaged electronic system 1. Metal barrier layer 144 is preferably provided with an overall thickness of about 0.5 mil to about 2 mil and is preferably comprised of a series of metal layers as described hereinbelow. Generally metal barrier layer 144 entirely seals the area enclosed within barrier support frame 118 and partially covers frame 118. Thus, no portion of polymer barrier layer 142, including its edges, is exposed to atmosphere.

The exposed side of layer 142 is adhesion-promoted prior to the deposition of metal barrier layer 144. Metal barrier layer 144 preferably comprises a layer of chromium 145 having a thickness of about 750 Angstroms (Å) to about 1500 Å, preferably 1000 Å, directly deposited on top of adhesion-promoted polymer barrier layer 142. Conventional deposition techniques, such as sputtering, chemical vapor deposition, or electroless metal deposition are used to deposit the layer of chromium; sputtering techniques are preferred. Metal barrier layer 144 further comprises a layer of copper 149 having a thickness of about 0.75 to about 2 micrometer, preferably about 1 micrometer. Conventional deposition techniques, such as sputtering, chemical vapor deposition, or electrolytic metal deposition are used to deposit the layer of copper; electrolytic metal deposition is preferred.

Since the presence of contaminants on the exposed surface of polymer barrier layer 142 is unavoidable, a plurality of voids 146 are invariably created in metal barrier layer 144, thus leaving some portions of polymer barrier layer 142 still exposed to the atmosphere. Therefore, packaged electronic system 1 is provided with a protective layer 147 on metal barrier layer 144 to bridge voids 146 in layer 144. Protective layer 147 is generally comprised of an inorganic corrosion resistant material, preferably a solder material. Solder materials suitable for protective layer 147 are alloys of gold/tin, silver/tin and tin/rubidium; gold/tin alloy is preferred. The solder material is deposited on metal barrier layer 144 by conventional means, such as chemical vapor deposition, electroplating and the like, electroplating being preferred. The thickness of protective layer 147 is dependent on the size (i.e. area) of individual voids 146 and should be roughly equal to the void size. Generally, the thickness of protective layer 147 is less than about 1 mil.

In order to further improve the bridging action of protective layer 147, it may be locally heated conventionally as by infrared heating, hot wire heating, directed hot gas reflow, or laser reflow such as an excimer laser, to reflow layer 147, with excimer laser heating being preferred.

If desired, packaged electronic system 1 may be provided with a predetermined number of pin connectors. As seen in FIG. 1, substrate 110 is provided with a hole 148. A conventional metal connector pin 150 is then embedded within a sleeve 152 of polymer dielectric material, such as ULTEM polyetherimide, positioned in hole 148. A metal barrier coating 154 is provided on the exposed side of connector pin 150 to furnish a hermetic seal to the pin connectors generally used in packaged electronic systems. Metal barrier coating 154 is made of same materials as material barrier 144 and the same aforementioned methods are used for depositing metal barrier coating 154.

Figure 2B:
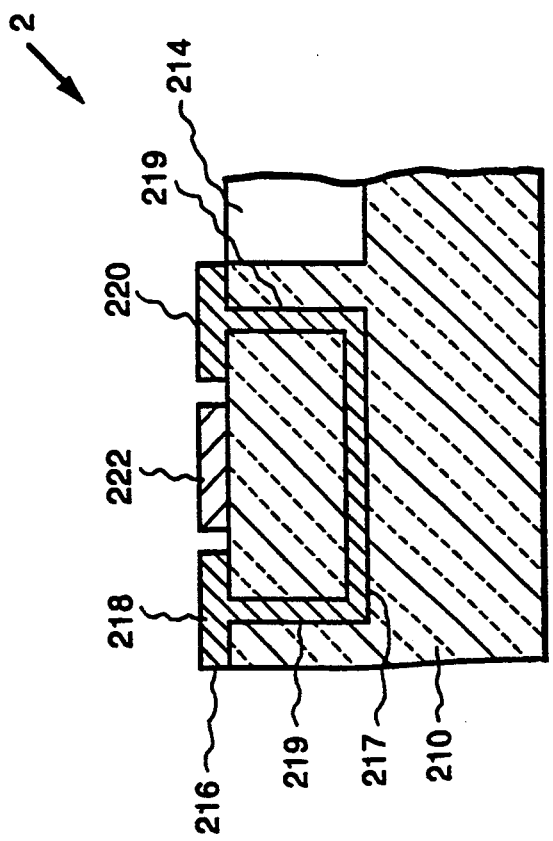
FIG. 2B is a partial cross-sectional side view of the second embodiment of the present invention at the completion of substrate fabrication of the second embodiment of the present invention.
Figure 2A:
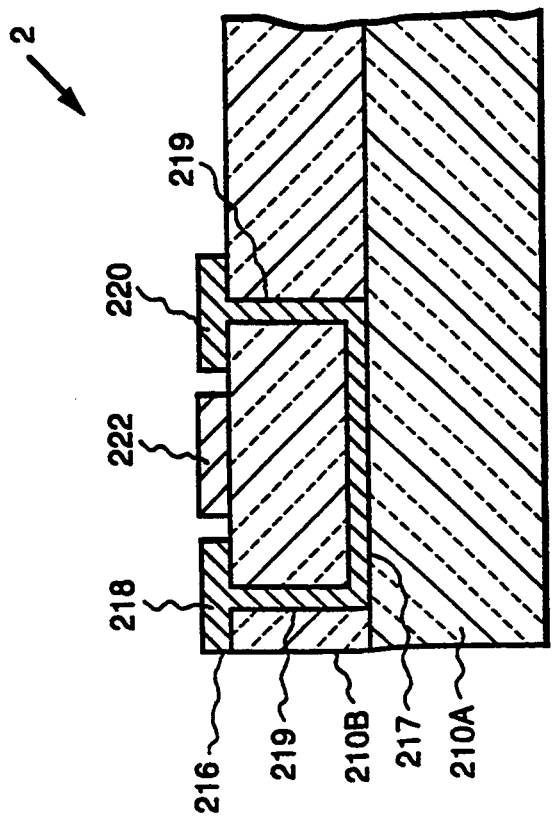
FIG. 2A is a partial cross-sectional side view, at the initial stage of substrate fabrication, of a second embodiment of the present invention.

FIGS. 2A and 2B show another embodiment of the present invention wherein a portion of module contact pads 216 are buried within a substrate 210. Only outer portions 218 and inner portions 220 of module contact pads 216 are exposed. FIG. 2B shows the final stage in a substrate fabrication process whereby substrate 210, module contact pad outer portions 218 and inner portions 220, and a buried first portion 217 and buried second portions 219 of module contact pads 216 form a cofired body, which also includes a barrier support frame 222.

A conventional multilayer ceramic fabrication process is employed, wherein the finished substrate 210 (FIG. 2A) starts off as a distinct laminated structure of green ceramic tapes. Green ceramic tape generally includes plasticizers and binders. Upon cofiring of the aforementioned laminated structure of green ceramic tapes, a monolithic structure is produced. Substrate 210 of FIG. 2B is comprised of the same material as substrate 110 in the aforementioned embodiment of FIG. 1.

Starting with a first green substrate layer 210A as shown in FIG. 2A, first portion 217 of module contact pads 216 is preferably screen printed on the desired surface of first green substrate layer 210A. A second green substrate layer 210B, with necessary holes punched for vias and registration, is subjected to similar process steps. Second portions 219, outer portions 218, and inner portions 220 of module contact pads 216 as well as barrier support frame 222 are screen printed on second green substrate layer 210B. The aforementioned screen printing steps are preferably carried out under vacuum conditions.

First green substrate layer 210A and second green substrate layer 210B are joined together to form a laminated substrate structure, which is then cofired in a sintering oven that employs a controlled atmosphere and temperature to produce monolithic substrate 210 (FIG. 2B) over a period of time. An initial stage, at a relatively lower temperature, is a binder burnout stage, which results in a relatively porous ceramic structure. The temperature is then increased to ultimately create a dense ceramic structure, thereby producing a hermetic cofired substrate. Since portions of module contact pads 216 are buried within substrate 210, support barrier frame 222 is electrically isolated from pads 216. Thus, support barrier frame 222 may be made of glass, glass-/ceramic or metal, such as Kovar and molybdenum. Resulting substrate 210 is then provided with desired cavities, such as a cavity 214.

The other components of the embodiment of FIG. 2B but not shown in FIG. 2B are the same as those disclosed in the embodiment of FIG. 1 and are fabricated by the same method as that disclosed hereinabove.

It will be recognized that while the foregoing discussion is generally directed to a hermetically sealed electronic package employing a plurality of electronic components, such as integrated circuit chips, the system and method is equally applicable to situations in which a single electronic component is present. The hermetically sealed packaged electronic system of the invention includes a lightweight, pliable and resilient hermetic seal, which can be subjected to conventional gross and fine leak tests without damage. Both the configuration and the methods described herein are economical and are readily achievable through simplified fabrication steps. It will further be recognized that the processing methods described herein provide significant advantages with respect to the physical and electrical characteristics of the resulting circuit packages.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A hermetically sealed packaged electronic system, comprising:
   a substrate;
   a plurality of module contact pads disposed on a desired surface of said substrate;
   a barrier support frame disposed on said desired surface, said frame having a perimeter dividing each of said plurality of module contact pads into an inner portion and an outer portion;
   a plurality of electronic components having interconnection pads thereon, all of said components being positioned within the perimeter of said barrier support frame;
   a polymer dielectric film overlying and bridging said electronic components, said polymer dielectric film having a plurality of via openings therein, with each of said via openings being aligned with at least some of said interconnection pads and said inner portions of said module contact pads;
   a pattern of interconnection conductors disposed on said polymer dielectric film and extending through associated via openings to provide electrical connection between at least some of said interconnection pads and said inner portions of said module contact pads;
   a polymer barrier layer disposed on said polymer dielectric film so as to entirely cover an area enclosed within said barrier support frame and also partially cover said barrier support frame about the entire periphery thereof;
   a metal barrier layer disposed on said polymer barrier layer and adhering to said barrier support frame about the entire periphery thereof so as to entirely cover a sealed area enclosed within said polymer barrier layer and said barrier support frame; and
   a protective layer disposed on said polymer barrier layer and bridging any voids that may be present in said metal barrier layer, so as to hermetically seal the volume bounded by said substrate, barrier support frame, metal barrier layer and protective layer.

2. The hermetically sealed packaged electronic system of claim 1, wherein said substrate comprises material selected from the group consisting of alumina and aluminum nitride.

3. The hermetically sealed packaged electronic system of claim 1, wherein said barrier support frame comprises material selected from the group consisting of glass and a composite of glass and a composite of glass and ceramic.

4. The hermetically sealed packaged electronic system of claim 1, wherein said polymer dielectric film comprises one of the group consisting of thermoplastic and thermosetting materials.

5. The hermetically sealed packaged electronic system of claim 1 wherein said interconnection pattern further comprises a layer of titanium on contact with said polymer dielectric film and a layer of copper on said layer of titanium.

6. The hermetically sealed packaged electronic system of claim 1, wherein said metal barrier layer further comprises a layer of chromium in contact with said polymer barrier layer and a layer of copper on said layer of chromium.

7. The hermetically sealed packaged electronic system of claim 1, wherein said protective layer comprises an alloy selected from the group of alloys consisting of gold and tin, silver and tin, and rubidium and tin.

8. The hermetically sealed packaged electronic system of claim 1, wherein adjacent peripheral edges of said polymer dielectric film and said polymer barrier layer are smoothly tapered.

9. The hermetically sealed packaged electronic system of claim 1, wherein each of said electronic components comprises a respective integrated circuit chip.

* * * * *